(12) United States Patent
Luan et al.

(10) Patent No.: US 12,299,353 B1
(45) Date of Patent: May 13, 2025

(54) DOA-BASED PUMPING STATION-LID JOINT MULTI-OBJECTIVE OPTIMIZATION METHOD

(71) Applicants: Hohai University, Jiangsu (CN); Nanjing lishuiqu water authority, Nanjing (CN); Jiangsu Yuzhi River Basin Management Technology Research Institute Co. Ltd, Jiangsu (CN)

(72) Inventors: Qinghua Luan, Jiangsu (CN); Haoyue Gao, Jiangsu (CN); Haitao Xing, Jiangsu (CN); Wenqiang Wang, Jiangsu (CN); Junlan Ge, Jiangsu (CN); Hanyu Wang, Jiangsu (CN); Xinyue Zhang, Jiangsu (CN); Haoda Zhang, Jiangsu (CN); Mengcai Wu, Jiangsu (CN)

(73) Assignees: Hohai University, Nanjing (CN); Nanjing Lishuiqu Water Authority, Nanjing (CN); Jiangsu Yuzhi River Basin Management Technology Research Institute Co., Ltd., Nanjing (CN)

( * ) Notice: Subject to any disclaimer, the term of this patent is extended or adjusted under 35 U.S.C. 154(b) by 0 days.

(21) Appl. No.: 18/677,509

(22) Filed: May 29, 2024

(30) Foreign Application Priority Data

Nov. 14, 2023 (CN) .......................... 202311511291.6

(51) Int. Cl.
*G06F 30/13* (2020.01)
*G06N 3/006* (2023.01)

(52) U.S. Cl.
CPC ............. *G06F 30/13* (2020.01); *G06N 3/006* (2013.01)

(58) Field of Classification Search
CPC ................................ G06N 3/006; G06F 30/13
See application file for complete search history.

(56) References Cited

FOREIGN PATENT DOCUMENTS

| CN | 110232472 A | 9/2019 |
|---|---|---|
| CN | 112699606 A | 4/2021 |

(Continued)

OTHER PUBLICATIONS

Hu (Hu, C., Yan, X., Gong, W., Liu, X., Wang, L., & Gao, L. (2020). Multi-objective based scheduling algorithm for sudden drinking water contamination incident. Swarm and Evolutionary Computation, 55, 100674.) (Year: 2020) .*

(Continued)

*Primary Examiner* — Bijan Mapar
(74) *Attorney, Agent, or Firm* — MUNCY, GEISSLER, OLDS & LOWE, P.C.

(57) ABSTRACT

A DOA-based pumping station-LID joint multi-objective optimization method, mainly including following steps: Step 1: collecting and sorting basic data of a research region; Step 2: fitting drainage parameter relationship expressions; Step 3: establishing an objective function and constraint conditions; Step 4: determining optimal solutions of a single objective function; Step 5: performing multi-objective function optimization calculation; Step 6: selecting an optimal solution. The multi-objective optimization method comprehensively considering economic and environmental benefits is particularly suitable for optimal design of installed flow capacity of a drainage pumping station at a watershed scale and layout rate of different LID measures. According to the method, regulation and storage effects of rivers, lakes, sunken green belts and permeable pavements in planning regions, and drainage effects of pumping stations are comprehensively considered, different solutions are designed (Continued)

according to local conditions, and a global optimal solution is quickly found using a DOA.

6 Claims, 1 Drawing Sheet

(56) References Cited

FOREIGN PATENT DOCUMENTS

| | | | |
|---|---|---|---|
| CN | 112712268 A | 4/2021 |
| CN | 112906950 A | 6/2021 |
| CN | 114912344 A | 8/2022 |
| CN | 116432022 A | 7/2023 |

OTHER PUBLICATIONS

Fecarotta (Fecarotta, O., Carravetta, A., Morani, M. C., & Padulano, R. (2018). Optimal pump scheduling for urban drainage under variable flow conditions. Resources, 7(4), 73.) (Year: 2018).*

Haixia Li, "Research on optimal design of rainwater system under the sponge city strategy—a case study of Nanjing Jiangbei New Area," Jan. 26, 2021, 102 pages.

* cited by examiner

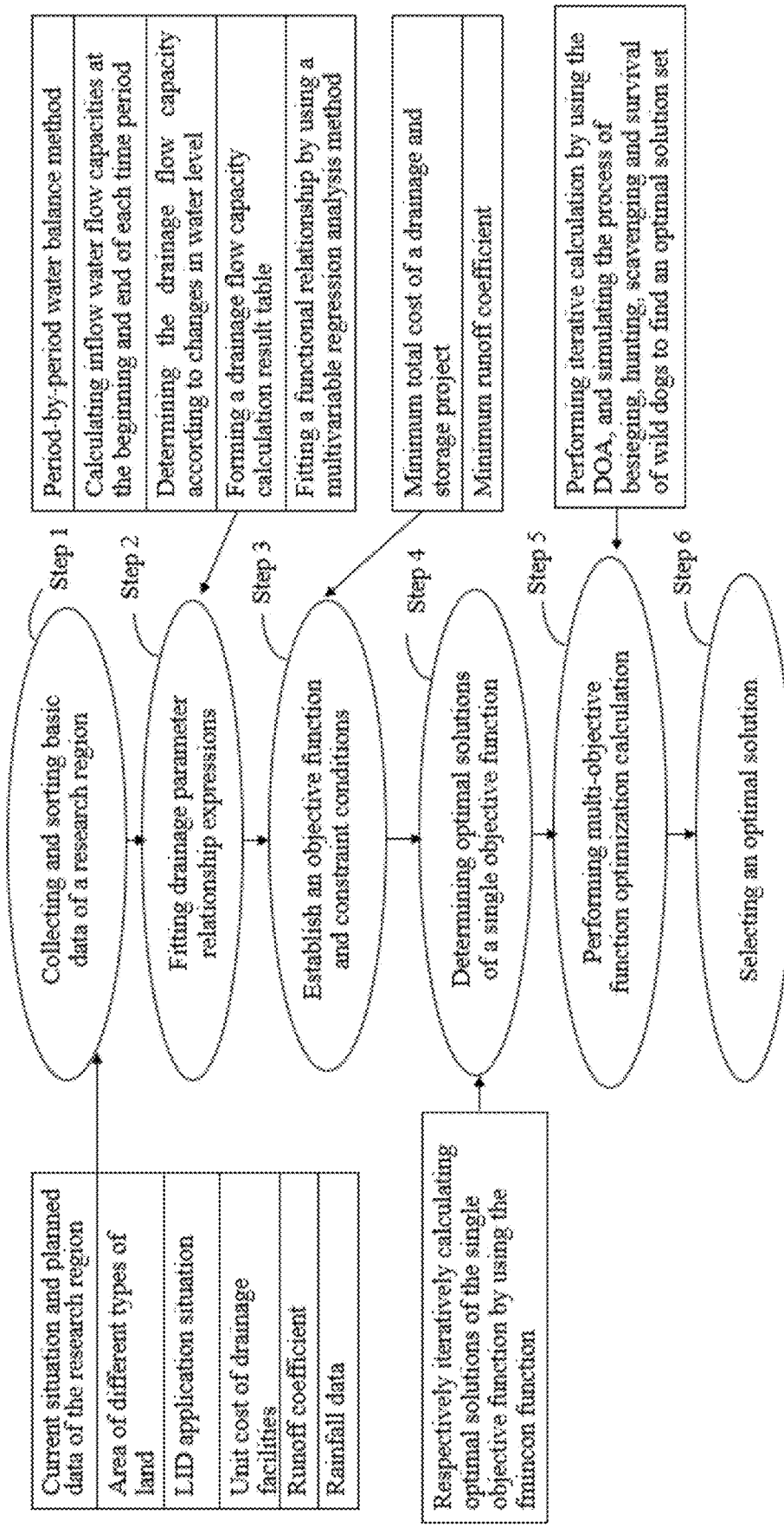

US 12,299,353 B1

DOA-BASED PUMPING STATION-LID JOINT MULTI-OBJECTIVE OPTIMIZATION METHOD

TECHNICAL FIELD

The present disclosure relates to the technical field of urban flood control and drainage construction, and relates to a DOA-based pumping station-LID joint multi-objective optimization method comprehensively considering economic and environmental benefits, which is particularly suitable for optimal design of the installed flow capacity of a drainage pumping station at a watershed scale and the layout rate of different LID measures.

BACKGROUND

Extreme rainstorm events occur frequently under the influence of global warming. Relying solely on the concept of source control in the past cannot cope with severe rainstorm scenarios. Meanwhile, the emergence of urban agglomerations has gradually expanded the regional scale to the watershed scale, and the expansion of rainfall spatial scale and the extension of rainwater collection time have increased the pressure on a watershed, so the amount of rainwater in the watershed cannot be completely reduced by relying solely on pumping station discharge. There is currently a lack of systematic research on urban drainage planning at the watershed scale, which ignores the joint effects of pumping station drainage flow capacity, regional water surface rate and LID measure layout rate on the runoff yield and concentration process, and there is a lack of an optimization algorithm that takes the water volume relationships between the above parameters as constraint conditions. Therefore, how to jointly apply drainage pumping stations and LID measures to form a relatively complete framework for source control and end treatment has become an urgent problem to be solved.

SUMMARY

In order to overcome the defects of the prior art, the present disclosure provides an optimization method for quickly determining optimal solutions of urban drainage parameters, which takes a construction standard for a sponge city in a research region as a principle, takes water volume relationships between urban drainage pumping stations at a watershed scale and LID measures as constraint conditions and comprehensively considers economic and environmental benefits.

In order to achieve the above object, the present disclosure provides the following solution:

A DOA-based pumping station-LID joint multi-objective optimization method, including:

Step 1: collecting and sorting basic data of a research region: collecting and sorting area of different types of land, lake and river water surface area, sunken green belt area and permeable pavement area of the research region, determining present value of investment and present value of operation management per unit flow capacity of a drainage pumping station, cost for excavation of lakes and rivers, and present value of layout construction cost (one-time construction investment) and present value of annual management and maintenance cost of different LID measures according to related information and in conjunction local actual conditions, and calculating basic data such as runoff coefficients of various types of land.

Step 2: fitting drainage parameter relationship expressions: since different water surface rates $x_2$ and $x_3$, sunken green belt rate $x_4$ and permeable pavement rate $x_5$ all affect an installed flow capacity $x_1$ of the drainage pumping station, fitting expressions of all drainage parameter relationships according to a drainage design standard of the research region, specifically including following steps:

Step 2.1: under the same drainage design standard, calculating the installed flow capacity of the drainage pumping station corresponding to different water surface rates, sunken green belt rates and permeable pavement rates through a period-by-period water balance method.

Step 2.2: performing calculation of drainage water regulation and storage in a planning region considering regulation and storage effects of rivers, lakes, sunken green belts and permeable pavements, and performing calculation using the period-by-period water balance method.

$$V_2 = V_1 + \frac{Q_1 + Q_2}{2} - q\Delta t \tag{2-1}$$

where $V_1$ and $V_2$ are river water storage volumes (m³) at the beginning and end of a time period; $Q_1$ and $Q_2$ are inflow water volumes (m³) at the beginning and end of the time period; q is a designed drainage capacity (m³/s) of external drainage of the pumping station; and $\Delta t$ is a time interval (h) between the beginning and end of the time period.

Step 2.3: calculating inflow water flow capacities at the beginning and end of each time period.

$$Q_1 = 0.8 \cdot P_1 \cdot F - 1000 x_4 \cdot F_{green\ belt} \cdot P_1 - 1000 x_5 \cdot F_{hardened} \cdot (1-\varphi) \cdot P_1 \tag{2-2}$$

$$Q_2 = 0.8 \cdot P_2 \cdot F - 1000 x_4 \cdot F_{green\ belt} \cdot P_2 - 1000 x_5 \cdot F_{hardened} \cdot (1-\varphi) \cdot P_2 \tag{2-3}$$

where $x_4$ is the planned sunken green belt rate (in % of total green belt area of the planning region); $x_5$ is the planned permeable pavement rate (in % of total urban hardened ground area); F is the total area of the planning region (km²); $F_{green\ belt}$ is the urban green belt area (km²); $F_{hardened}$ is the urban hardened ground area (km²); $P_1$ and $P_2$ are the rainfall in each time period, where considering that part of the rainfall is lost, 80% of the rainfall is taken to calculate the designed rainfall (mm), and $\varphi$ is a rainfall runoff coefficient of the permeable pavement, which is generally 0.08 to 0.45, preferably 0.2; and other parameter symbols have the same meaning as above.

Step 2.4: performing time period regulation and storage calculation based on the normal water level, initial discharge level, minimum control water level and maximum control water level, and controlling the water level of an inland river under the control of pumping station startup and drainage between the minimum control water level and the maximum control water level.

Step 2.5: determining approximate operating ranges of water surface rates, sunken green belt rates and the permeable pavement rates according to the basic data of the research region, and calculating installed flow capacities of the drainage pumping station corresponding to different water surface rates, sunken green belt rates and permeable pavement rates, to form a drainage flow capacity calculation result table.

Step 2.6: according to the drainage flow capacity calculation result table formed in step 2.5, fitting a functional relationship between the installed flow capacity of the drainage pumping station and the water surface rate, sunken green belt rate and permeable pavement rate by using a multivariable regression analysis method, $$x_1 = f(x_2, x_3, x_4, x_5) \quad (2-4)$$

Step 3: establishing an objective function and constraint conditions: in order to comprehensively consider economic and environmental benefits, constructing a function by taking the minimum total cost of a drainage and storage project and the minimum the runoff coefficient as objectives, and determining ranges of values of all parameters according to the existing and planned conditions of the research region, specifically including following steps:

Step 3.1: based on the related basic data collected and sorted in step 1, constructing an objective function by taking the minimum total cost of the drainage and storage project and the minimum runoff coefficient as objectives, $$Z = \begin{cases} F_{cost} = \min(C_1 + C_2) \cdot x_1 + C_3 \cdot (x_2 - p_1) \cdot F \cdot h_1 + C_4 \cdot (x_3 - p_2) \cdot \\ F \cdot h_2 + (C_5 + C_6) \cdot x_4 \cdot F_{green\ belt} + (C_7 + C_8) \cdot x_5 \cdot F_{hardened} \\ \alpha = \\ \{F_{green\ belt}(1-x_4)\alpha_1 + F_{green\ belt}x_4\alpha_2 + F_{(x_2+x_3)} + F_{hardened}x_5\alpha_3 + \\ F_{hardened}(1-x_5)\alpha_4 + (F - F_{green\ belt} - F_{hardened})\alpha_5\} \\ \min \qquad\qquad\qquad\qquad\qquad\qquad\qquad\qquad /F \end{cases}$$

(3-1)

where $C_1$ and $C_2$ are the present value of investment and the present value of operation management per unit flow capacity of the drainage pumping station (RMB: 00,000); $C_3$ is the cost of excavating the lake per cubic meter (RMB: 00,000); $C_4$ is the cost of excavating the river network per cubic meter (RMB: 00,000); $C_5$ and $C_6$ are the present value of construction cost (one-time construction investment) and the present value of annual management and maintenance cost of the sunken green belt per square meter (RMB: 00,000); $C_7$ and $C_8$ are the present value of construction cost (one-time construction investment) and the present value of annual management and maintenance cost of the permeable pavement per square meter (RMB: 00,000); $X_1$ is the installed flow capacity of the drainage pumping station (m³/s); $X_2$ is the planned lake water surface rate (in % of the planning region); $X_3$ is the planned river network water surface rate (in % of the planning region); $P_1$ is the existing lake water surface rate (in % of the planning region); $P_2$ is the existing river network water surface rate (in % of the planning region); $h_1$ is the average depth of the lake; $h_2$ is the average depth of the river network; $F_{cost}$ is the total cost of the drainage and storage project; F is the total area of the planning region; $F_{green\ belt}$ is the urban green belt area; $F_{hardened}$ is the urban hardened ground area; $\alpha$ is the comprehensive runoff coefficient; $\alpha_1$ is the runoff coefficient corresponding to the ordinary green belt; $\alpha_2$ is the runoff coefficient corresponding to the sunken green belt; $\alpha_3$ is the runoff coefficient corresponding to the permeable pavement; $\alpha_4$ is the runoff coefficient corresponding to the hardened impermeable road surface; $\alpha_5$ is the runoff coefficient corresponding to other land; and other symbols have the same meaning as above.

Step 3.2: based on the data collected in step 1 and the drainage parameter relationship fitted in step 2, determining constraint conditions;

$$\begin{cases} x_1 \geq \dfrac{0.3 \cdot 0.8 \cdot P \cdot F}{3.6 \cdot T} \\ x_2 \geq x_2^*, x_3 \geq x_3^*, x_2 + x_3 \leq \dfrac{F - F_{green\ belt} - F_{hardened}}{F} \\ x_4 \geq x_4^*, x_5^* \leq x_5 \leq \dfrac{F_{hardened} - F_{road} - F_{construction\ land}}{F_{hardened}} \\ x_1 = f(x_2, x_3, x_4, x_5) \end{cases} \quad (3-2)$$

where $x_2^*$ and $x_3^*$ are the minimum lake water surface rate and minimum river network water surface rate respectively (in % of total area of the research region); $x_4^*$ and $x_5^*$ are the index values of specified sunken green belt rate and the permeable pavement rate respectively (in % of total area of green belt and total area of hardened ground of the research region); P is the rainfall (mm), where considering that part of the rainfall is lost and stored by other facilities, 80% of the rainfall is taken to calculate the runoff; T is the designed drainage duration (h); and other parameter symbols have the same meaning as above.

Step 4: determining optimal solutions of a single objective function: respectively finding optimal solutions of single functions by using a fmincon function and the function constraint conditions in step 4, specifically including following steps:

Step 4.1: fmincon mathematical model:
minimize f(x)

$$\begin{cases} c(x) \leq 0 \\ ceq(x) = 0 \\ lb \leq x \leq ub \end{cases} \quad (4-1)$$

where f(x) is an objective function; C(x) and ceq(x) are nonlinear functions; and lb and ub are boundary conditions;

Step 4.2: respectively iteratively calculating variable values $\overline{x}_{*1}$, $\overline{x}_{*2}$ and optimal function values $fval_1$, $fval_2$ that optimize the total cost F of the objective function drainage and storage project and the total runoff control rate $\alpha$ by using the fmincon function.

Step 5: performing multi-objective function optimization calculation. Based on the multi-objective function and constraint conditions established in step 3 and the optimal solutions of the single objective function in step 4, the multi-objective functions are iteratively calculated by using the DOA, a problem space is regarded as a predatory space, and the process of besieging, hunting, scavenging and survival when wild dogs hunt large prey is simulated to find an optimal solution set, where the DOA has the advantages of fast convergence speed and strong local search capability, and specifically includes following steps:

Step 5.1: respectively calculating variable values $\vec{x}_{*1}$, $\vec{x}_{*2}$ and optimal function values $fval_1$, $fval_2$ that optimize the total cost F of the objective function drainage and storage project and the total runoff control rate $\alpha$.

Step 5.2: initializing the number of population, the number of iterations and the range of problem space, and randomly allocating the position of the populations in the problem space.

Step 5.3: each wild dog represents a potential solution to an optimization problem, fitness functions of all wild dogs are calculated, and according to the fitness functions, a wild dog of which the fitness value is the lowest is selected as a "leader", that is, a position closer to the optimal solution, $$\text{fitness}(i) = \sqrt{(f_{i1}(t) - fval_1)^2 + (f_{i2}(t) - fval_2)^2} \quad (5-1)$$

where $f_{i1}(t)$ and $f_{i2}(t)$ are values substituted into the objective functions F and a by the $i^{th}$ searcher in the current iteration.

Step 5.4: each dog chooses three behaviors, comprising: besieging, hunting, scavenging based on a certain probability, which are specifically described as follows:

(1) besieging: multiple searchers approach the position of prey, that is, search towards our target optimization position $\overline{x}_*$ and obtain a new position:

$$\vec{x}_i(t+1) = \beta_1 \sum_{k=1}^{na} \frac{[\vec{\varphi}_k(t) - \vec{x}_i(t)]}{na} - \vec{x}_*(t) \quad (5\text{-}2)$$

where $\vec{x}_i(t+1)$ is a new position of the $i^{th}$ searcher; na is a randomly generated integer in the interval [2, SizePop/2]; SizePop is an initial number of populations; $\vec{\varphi}_k(t)$ is a randomly generated wild dog subgroup; $\vec{x}_i(t)$ is a current position of the searcher; $\vec{x}_*(t)$ is the global optimal individual in the previous iteration; and a random scale factor within $\beta_1$:[−2, 2] changes the size and direction of a motion trajectory.

(2) Hunting: hunting small prey, that is, searching near the global optimal position individual $\vec{x}_*(t)$ in the current iteration, and obtaining a new position;

$$\vec{x}_i(t+1) = \vec{x}_*(t) + \beta_1 e^{\beta_2}(\vec{x}_{r_1}(t) - \vec{x}_i(t)) \quad (5\text{-}3)$$

where $\beta_2$ is a random number within [−1,1]; and other symbols have the same meaning as above.

(3) Scavenging: discovering a behavior of consuming carrion when randomly walking, that is, selecting a new position between the current position and any searcher:

$$\vec{x}_i(t+1) = \frac{1}{2}\left[e^{\beta_2}\vec{x}_{r_1}(t) - (-1)^\sigma * \vec{x}_i(t)\right] \quad (5\text{-}4)$$

where $r_1$ and $r_2$ are two searchers randomly selected, $i \neq r_1$, $r_1 \neq r_2$; and other symbols have the same meaning as above.

Step 5.5: calculating the survival probability of each dog, and moving to the vicinity of the global optimal individual $\overline{X}_*(t)$ when the survival probability is less than a certain value:

$$\text{survival}(i) = \frac{\text{fitness}_{max} - \text{fitness}(i)}{\text{fitness}_{max} - \text{fitness}_{min}} \quad (5\text{-}5)$$

$$\vec{x}_i(t) = \vec{x}_*(t) + \frac{1}{2}\left[\vec{x}_{r_1}(t) - (-1)^\sigma * \vec{x}_{r_2}(t)\right] \quad (5\text{-}6)$$

where $\sigma$ is a binary number of 0 or 1; and other symbols have the same meaning as above;

Step 5.6: updating the "leader" according to a new fitness function value, comprising: the global optimal individual position $\overline{X}_*(t+1)$.

Step 5.7: repeating steps 5.3, 5.4, and 5.5 until an iteration stop condition is reached.

Step 6: selecting an optimal solution: based on the principle of minimizing the present value of the total cost of the drainage and storage project, selecting an optimal configuration solution for the installed flow capacity of the drainage pumping station, water surface rate, sunken green belt rate, and permeable pavement rate from the optimal solution set obtained in step 5.

According to specific embodiments provided by the present disclosure, the present disclosure discloses the following technical effects:

The present disclosure provides a DOA-based pumping station-LID joint multi-objective optimization method, including: collecting and sorting basic data of a research region; fitting drainage parameter relationship expressions; establishing an objective function and constraint conditions; determining optimal solutions of a single objective function; and performing multi-objective function optimization calculation. According to the present disclosure, regulation and storage effects of rivers, lakes, sunken green belts and permeable pavements in planning regions, and drainage effects of pumping stations are comprehensively considered, and a global optimal solution is quickly found using the DOA, improving economic and environmental benefits.

BRIEF DESCRIPTION OF DRAWINGS

In order to explain the technical solutions in the embodiments of the present disclosure or the prior art more clearly, the drawings to be used in the embodiments will be briefly introduced below. Obviously, the drawings in the following description show merely some embodiments of the present disclosure. Those of ordinary skill in the art may obtain other drawings based on these drawings without creative efforts.

The sole FIGURE is a flowchart of a method provided by an embodiment of the present disclosure.

DETAILED DESCRIPTION OF EMBODIMENTS

The technical solutions in the embodiments of the present disclosure will be clearly and completely described as below with reference to the accompanying drawings in the embodiments of the present disclosure. Obviously, the described embodiments are only some of, not all of, the embodiments of the present disclosure. All other embodiments obtained by a person of ordinary skill in the art based on the embodiments of the present disclosure without creative effort shall fall into the protection scope of the present disclosure.

Embodiment

The optimization method described in the present disclosure is applied to the main urban area of Yi County, Hebei Province, P.R. China. The technical process includes: collecting and sorting basic data of a research region, fitting a drainage parameter relationship, establishing an objective function and constraint conditions, determining optimal solutions of a single objective function, performing multi-objective function optimization calculation, and selecting an optimal solution. The specific process is as follows:

(1) Collecting and sorting related basic data of a research region, including the existing data and planned data of the research region.

(2) According to the requirements of sponge city construction, in conjunction with the land use requirements and water system characteristics of the research region, ensuring that the water level of the main river does not exceed the control water level in each time period (1 minute as one time period) by taking the drainage standard of reaching the maximum 2-hour rainfall once in 20 years, planning to completely discharge the regulated and stored flood in the same day where the runoff is generated by 2-hour rainfall, performing calculation using the period-by-period water balance method, determining approximate operating ranges of water surface rates, sunken green belt rates and permeable pavement rates according to the basic data of the main urban area of Yixian County and the constraints in the mathematical model, that is, different water surface rates (5.8% to 8.8%), sunken green belt rates (30% to 70%) and permeable pavement rates (15% to 30%), further fitting the relationship between the installed flow capacity of the drainage pumping station and the water surface rate, sunken green belt rate and permeable pavement rate using the multivariable regression analysis method, obtaining a function relationship expression:

$$x_1 = -2217.3(x_2+x_3) - 130.2x_4 - 257.6x_5 + 431.12 \quad (1)$$

(3) Further, establishing an objective function, including: taking the minimum total cost of drainage and storage project as a first objective function, and taking the minimum runoff coefficient as a second objective function, comprehensively determining constraint conditions of all drainage parameters according to lakes and rivers of the research region, LID measures, existing area and planned area, and the above fitting relationship, obtaining the objective function and constraint conditions as follows:

Objective Function:

$$Z = \left\{ \begin{array}{l} \min f(x) = 110x_1 + 32568x_2 + 37996x_3 + 17494.5x_4 + 87156x_5 - 1329.86 \\ \min \alpha = \{(8.8205x_2 - 8.8205x_3 - 0.327x_4 - 4.035x_5 + 8.861)/13.57\} \end{array} \right\} \quad (2)$$

Constraint Conditions:

$$\begin{cases} x_1 \geq 12.98 \\ x_2 \geq 1\%, \ x_3 \geq 12\%, \ x_2 + x_3 \leq 16.43\% \\ 30\% \leq x_4 \leq 80\% \\ 15\% \leq x_5 \leq 24.78\% \\ x_1 = -2217.3(x_2 + x_3) - 130.2x_4 - 257.6x_5 + 431.12 \end{cases} \quad (3)$$

(4) Further, respectively iteratively calculating variable values {12.98, 0.01, 0.12, 0.30, 0.15}, {12.98, 0.01, 0.15, 0.80, 0.2478} and optimal function values 23304.89, 0.466 that minimize the total cost of the objective function drainage and storage project and the runoff coefficient by using the fmincon function.

(5) Iteratively calculating the multi-objective functions by using the DOA, initializing the number of populations to na and the number of iterations to 100 according to the constraint conditions and the optimal function values mentioned above, and randomly allocating the position of the populations in the problem space to calculate 100 sets of optimal solutions.

(6) When selecting, based on the first principle of minimize the total cost of the drainage and storage project, selecting a set of solution of which the cost is the lowest from the 100 sets of optimal solutions generated in the above steps. In this case, the total cost of the drainage and storage project is 243.5791 million yuan, the runoff coefficient is 0.5423, and the corresponding variable value {13.86, 3.17%, 12.11%, 30.02%, 15.23%} is the optimal configuration solution for the installed flow capacity of the drainage pumping station of the research region, lake water surface rate, river water surface rate, sunken green belt rate and permeable pavement rate.

The specific embodiment is applied herein to explain the principle and implementation of the present disclosure. The above embodiment is only used to help understand the method and core idea of the present disclosure. Meanwhile, for those of ordinary skill in the art, there may be changes in specific implementation and application scope based on the idea of the present disclosure. In summary, the content of this specification should not be understood as a limitation on the present disclosure.

What is claimed is:

1. A DOA (Direction of Arrival)-based pumping station-LID (Low Impact Development) joint multi-objective optimization method, wherein the method is stored in a non-transitory readable storage medium, the method comprising:

Step 1: collecting and sorting basic data of a research region, wherein in order to acquire related basic data of the research region, it is necessary to determine the proportion of area of different types of land and the layout of LID measures, and determine unit investment costs of various drainage facilities by consulting relevant information and combining with the local actual conditions to calculate runoff coefficients of various types of land using one or more processors; meanwhile, planning should be carried out in accordance with the requirements of sponge city construction and flood control design standards;

Step 2: fitting drainage parameter relationship expressions using the one or more processors: based on the basic data acquired in step 1, fitting expressions of relationships between installed flow capacities of a drainage pumping station and water surface rates, sunken green belt rates and permeable pavement rates by adopting a multivariable linear regression method using the one or more processors;

Step 3: establishing an objective function and constraint conditions using the one or more processors: constructing a function by taking the minimum total cost of a drainage and storage project and the minimum runoff coefficient as objectives, and determining constraint conditions of all parameters based on the related data and fitting relationships obtained in step 1 and step 2;

Step 4: determining optimal solutions of a single objective function using the one or more processors: based on the objective function and constraint conditions established in step 3, iteratively calculating variable values and optimal function values that minimize the total cost of the objective function drainage and storage project and minimize the runoff coefficient by using a fmincon function;

Step 5: performing multi-objective function optimization calculation using the one or more processors: based on the multi-objective function and constraint conditions established in step 3 and the optimal solutions of the single objective function in step 4, iteratively calculating the multi-objective functions by using a Dingo Optimization Algorithm (DOA) to obtain an optimal solution set meeting the conditions; and Step 6: selecting an optimal solution using the one or more processors: based on the principle of minimizing the present value of the total cost of the drainage and storage project, selecting an optimal configuration solution for the installed flow capacity of the drainage pumping station, water surface rate, sunken green belt rate and permeable pavement rate from the optimal solution set obtained in step 5;

controlling the drainage and storage project based on the optimal configuration solution for the installed flow capacity of the drainage pumping station, water surface rate, sunken green belt rate and permeable pavement rate.

2. The DOA-based pumping station-LID joint multi-objective optimization method according to claim 1, wherein the fitting expressions of relationships between installed flow capacities of a drainage pumping station and water surface rates, sunken green belt rates and permeable pavement rates by adopting a multivariable linear regression method of step 2 specifically comprises following steps:

Step 2.1: under the same drainage design standard, calculating designed drainage flow capacities of the external drainage of the pumping station corresponding to different water surface rates, sunken green belt rates and permeable pavement rates through a period-by-period water balance method;

Step 2.2: performing calculation of drainage water regulation and storage in a planning region considering regulation and storage effects of rivers, lakes, sunken green belts and permeable pavements, performing calculation using the period-by-period water balance method, wherein the calculation formula of the river water storage capacity is:

$$V_2 = V_1 + \frac{Q_1 + Q_2}{2} - q\Delta t$$

where $V_1$ and $V_2$ are river water storage volumes (m³) at the beginning and end of a time period; $Q_1$ and $Q_2$ are inflow water volumes (m³) at the beginning and end of the time period; q is a designed drainage capacity (m³/s) of external drainage of the pumping station; and $\Delta t$ is a time interval (h) between the beginning and the end of the time period;

Step 2.3: calculating inflow water flow capacities at the beginning and end of each time period, $Q_1=0.8 \cdot P_1 \cdot F - 1000x_4 \cdot F_{green\ belt} \cdot P_1 \cdot 1000x_5 \cdot F_{hardened} \cdot (1-\varphi) \cdot P_1$ $Q_2=0.8 \cdot P_2 \cdot F - 1000x_4 \cdot F_{green\ belt} \cdot P_2 \cdot 1000x_5 \cdot F_{hardened} \cdot (1-\varphi) \cdot P_2$ where $x_4$ is the planned sunken green belt rate; $x_5$ is the planned permeable pavement rate; F is the total area of the planning region (km²); $F_{green\ belt}$ is the urban green belt area (km²); $F_{hardened}$ is the urban hardened ground area (km²); $P_1$ and $P_2$ are the rainfall in each time period, where considering that part of the rainfall is lost, 80% of the rainfall is taken to calculate the designed rainfall (mm), and $\varphi$ is a rainfall runoff coefficient of the permeable pavement;

Step 2.4: performing time period regulation and storage calculation based on the normal water level, initial discharge level, minimum control water level and maximum control water level, and controlling the water level of an inland river under the control of pumping station startup and drainage between the minimum control water level and the maximum control water level;

Step 2.5: determining approximate operating ranges of water surface rates, sunken green belt rates and permeable pavement rates according to the basic data of the research region, and calculating installed water capacities of the drainage pumping station corresponding to different water surface rates, sunken green belt rates and permeable pavement rates, to form a drainage flow capacity calculation result table; and Step 2.6: according to the drainage flow capacity calculation result table formed in step 2.5, fitting a functional relationship between the installed flow capacity of the drainage pumping station and the water surface rate, sunken green belt rate and permeable pavement rate by using a multivariate regression analysis method:

$$x_1 = f(x_2, x_3, x_4, x_5) \qquad (2\text{-}4).$$

3. The DOA-based pumping station-LID joint multi-objective optimization method according to claim 2, wherein the in order to comprehensively consider economic and environmental benefits, constructing a function by taking the minimum total cost of the drainage and storage project and the minimum runoff coefficient as objectives, and determining ranges of values of all parameters according to the existing and planned conditions of the research region of step 3 specifically comprises following steps:

Step 3.1: based on the related basic data collected and sorted in step 1, constructing an objective function by taking the minimum total cost of the drainage and storage project and the minimum runoff coefficient as objectives, $$Z = \begin{cases} F_{cost} = \min(C_1 + C_2) \cdot x_1 + C_3 \cdot (x_2 - p_1) \cdot F \cdot h_1 + C_4 \cdot (x_3 - p_2) \cdot \\ F \cdot h_2 + (C_5 + C_6) \cdot x_4 \cdot F_{green\ belt} + (C_7 + C_8) \cdot x_5 \cdot F_{hardened} \\ \alpha = \\ \{F_{green\ belt}(1-x_4)\alpha_1 + F_{green\ belt}x_4\alpha_2 + F_{(x_2+x_3)} + F_{hardened}x_5\alpha_3 + \\ F_{hardened}(1-x_5)\alpha_4 + (F - F_{green\ belt} - F_{hardened})\alpha_5\} \\ \min \qquad\qquad\qquad\qquad\qquad\qquad\qquad\qquad /F \end{cases}$$

where $C_1$ and $C_2$ are the present value of investment and the present value of operation management of unit flow capacities of the drainage pumping station; $C_3$ is the cost of excavating the lake per cubic meter; $C_4$ is the cost of excavating the river network per cubic meter; $C_5$ and $C_6$ are the present value of construction cost and the present value of annual management and maintenance cost of the sunken green belt per square meter; $C_7$ and $C_8$ are the present value of construction cost and the present value of annual management and maintenance cost of the permeable pavement per square meter; $X_1$ is the installed flow capacity of the drainage pumping station; $X_2$ is the planned lake water surface rate; $X_3$ is the planned river network water surface rate; $P_1$ is the existing lake water surface rate; $P_2$ is the existing river network water surface rate; $h_1$ is the average depth of the lake; $h_2$ is the average depth of the river network; $F_{cost}$ is the total cost of the drainage and storage project; F is the total area of the planning region; $F_{green\ belt}$ is the urban green belt area; $F_{hardened}$ is the urban hardened ground area; $\alpha$ is the comprehensive runoff coefficient; $\alpha_1$ is the runoff coefficient corresponding to the ordinary green belt; $\alpha_2$ is the runoff coefficient corresponding to the sunken green belt; $\alpha_3$ is the runoff coefficient corresponding to the permeable pavement; $\alpha_4$ is the runoff coefficient corresponding to the hardened impermeable road surface; and as is the runoff coefficient corresponding to other land;

Step 3.2: based on the data collected in step 1 and the drainage parameter relationship fitted in step 2, determining constraint conditions, $$\begin{cases} x_1 \geq \dfrac{0.3 \cdot 0.8 \cdot P \cdot F}{3.6 \cdot T} \\ x_2 \geq x_2^*, x_3 \geq x_3^*, x_2 + x_3 \leq \dfrac{F - F_{green\ belt} - F_{hardened}}{F} \\ x_4 \geq x_4^*, x_5^* \leq x_5 \leq \dfrac{F_{hardened} - F_{road} - F_{construction\ land}}{F_{hardened}} \\ x_1 = f(x_2, x_3, x_4, x_5) \end{cases}$$

where $x_2^*$ and $x_3^*$ are the minimum lake water surface rate and minimum river network water surface rate respectively; $x4^*$ and $x_5^*$ are the index values of specified sunken green belt rate and the permeable pavement rate respectively; P is the rainfall; and T is the designed drainage duration.

4. The DOA-based pumping station-LID joint multi-objective optimization method according to claim 3, wherein the finding optimal solutions of single functions by using a fmincon function and the function constraint conditions in step 4 specifically comprises following steps:

Step 4.1: fmincon mathematical model:

$$\text{minimize } f(x)$$
$$\begin{cases} c(x) \leq 0 \\ ceq(x) = 0 \\ lb \leq x \leq ub \end{cases}$$

where f(x) is an objective function; lb and ub are boundary conditions; and C(x) and ceq(x) are nonlinear functions; and Step 4.2: respectively iteratively calculating variable values $\vec{x}_{*1}$, $\vec{x}_{*2}$ and optimal function values $fval_1$, $fval_2$ that optimize the total cost F of the objective function drainage and storage project and the total runoff control rate $\alpha$ by using the fmincon function.

5. The DOA-based pumping station-LID joint multi-objective optimization method according to claim 4, wherein based on the multi-objective function and constraint conditions established in step 3 and the optimal solutions of the single objective function in step 4, the multi-objective functions are iteratively calculated by using the DOA, a problem space is regarded as a predatory space, and the process of besieging, hunting, scavenging and survival when wild dogs hunt large prey is simulated to find an optimal solution set, wherein the DOA has the advantages of fast convergence speed and strong local search capability, and specifically comprises following steps:

Step 5.1: respectively calculating variable values $\vec{x}_{*1}$, $\vec{x}_{*2}$ and optimal function values $fval_1$, $fval_2$ that optimize the total cost F of the objective function drainage and storage project and total runoff control rate $\alpha$;

Step 5.2: initializing the number of population, the number of iterations and the range of problem space, and randomly allocating the position of the populations in the problem space;

Step 5.3: each wild dog represents a potential solution to an optimization problem, fitness functions of all wild dogs are calculated, and according to the fitness functions, a wild dog of which the fitness value is the lowest is selected as a "leader", that is, a position closer to the optimal solution, $$\text{fitness}(i) = \sqrt{(f_{i1}(t) - fval_1)^2 + (f_{i2}(t) - fval_2)^2}$$

where $f_{i1}(t)$ and $f_{i2}(t)$ are values substituted into the objective functions F and $\alpha$ by the $i^{th}$ searcher in the current iteration;

Step 5.4: each dog chooses three behaviors, comprising: besieging, hunting, scavenging based on a certain probability, which are specifically described as follows:

(1) besieging: multiple searchers approach the position of prey, that is, search towards our target optimization position and obtain a new position;

$$\vec{x}_i(t+1) = \beta_1 \sum_{k=1}^{na} \frac{[\vec{\varphi}_k(t) - \vec{x}_i(t)]}{na} - \vec{x}_*(t)$$

where $\vec{x}_i(t+1)$ is a new position of the $i^{th}$ searcher; na is a randomly generated integer in the interval [2, SizePop/2]; SizePop is an initial number of populations; $\vec{\varphi}_k(t)$ is a randomly generated wild dog subgroup; $\vec{x}_i(t)$ is a current position of the searcher; $\vec{x}_*(t)$ is a global optimal individual in the previous iteration; and a random scale factor within $\beta_1$:[−2, 2] changes the size and direction of a motion trajectory;

(2) hunting: hunting small prey, that is, searching near the global optimal position individual $\vec{x}_*(t)$ in the current iteration, and obtaining a new position;

$$\vec{x}_i(t+1) = \vec{x}_*(t) + \beta_1 e^{\beta_2}(\vec{x}_{r_1}(t) - \vec{x}_i(t))$$

where $\beta_2$ is a random number within [−1,1];

(3) scavenging: discovering a behavior of consuming carrion when randomly walking, that is, selecting a new position between the current position and any searcher, $$\vec{x}_i(t+1) = \frac{1}{2}\left[e^{\beta_2}\vec{x}_{r_1}(t) - (-1)^{\sigma} * \vec{x}_i(t)\right]$$

where $r_1$ and $r_2$ are two searchers randomly selected, $i \neq r_1$, $r_1 \neq r_2$;

Step 5.5: calculating the survival probability of each dog, and moving to the vicinity of the global optimal individual $\overline{x}_*(t)$ when the survival probability is less than a certain value:

$$\text{survival}(i) = \frac{\text{fitness}_{max} - \text{fitness}(i)}{\text{fitness}_{max} - \text{fitness}_{min}}$$

$$\vec{x}_i(t) = \vec{x}_*(t) + \frac{1}{2}\left[\vec{x}_{r_1}(t) - (-1)^{\sigma} * \vec{x}_{r_2}(t)\right]$$

where $\sigma$ is a binary number of 0 or 1;

Step 5.6: updating the "leader" according to a new fitness function value, comprising: the global optimal individual position $\vec{x}_*(t+1)$; and Step 5.7: repeating steps 5.3, 5.4, and 5.5 until an iteration stop condition is reached.

6. The DOA-based pumping station-LID joint multi-objective optimization method according to claim 5, wherein based on the principle of minimizing the present value of the total cost of the drainage and storage project, an optimal configuration solution for the installed flow capacity of the drainage pumping station, water surface rate, sunken green belt rate and permeable pavement rate is selected from the optimal solution set obtained in step 5.

\* \* \* \* \*